United States Patent [19]

Oechsner

[11] Patent Number: 5,156,703
[45] Date of Patent: Oct. 20, 1992

[54] MTHOD FOR THE SURFACE TREATMENT OF SEMICONDUCTORS BY PARTICLE BOMBARDMENT

[76] Inventor: Hans Oechsner, Vogelweher Strasse 7 B, D-6750 Kaiserslautern, Fed. Rep. of Germany

[21] Appl. No.: 415,258

[22] Filed: Nov. 20, 1989

[30] Foreign Application Priority Data

Mar. 18, 1987 [DE] Fed. Rep. of Germany ....... 3708717

[51] Int. Cl.$^5$ .......................................... H01L 21/306
[52] U.S. Cl. .................................. 156/643; 156/345; 437/16; 118/723; 250/492.3
[58] Field of Search ............... 156/628, 643, 345, 662; 437/16, 20; 219/121.38, 121.36; 118/723; 250/492.2, 492.3

[56] References Cited

U.S. PATENT DOCUMENTS

| 4,123,316 | 10/1978 | Tsuchimoto | 156/643 |
| 4,178,877 | 12/1979 | Kudo | 156/646 |
| 4,243,506 | 1/1981 | Ikeda et al. | 156/643 |
| 4,401,054 | 8/1983 | Matsuo | 118/723 |
| 4,450,031 | 5/1984 | Ono et al. | 156/643 |

FOREIGN PATENT DOCUMENTS

| 0106497 | 4/1984 | European Pat. Off. . | |
| 2810554 | 9/1978 | Fed. Rep. of Germany . | |
| 2933850 | 3/1980 | Fed. Rep. of Germany . | |
| 3117252 | 8/1982 | Fed. Rep. of Germany . | |
| 2402301 | 3/1979 | France . | |
| 150479 | 9/1981 | German Democratic Rep. . | |
| 57-40932 | 3/1982 | Japan . | |
| 58-100430 | 6/1983 | Japan | 156/345 |
| 59-126778 | 7/1984 | Japan . | |
| 60-211942 | 10/1985 | Japan | 156/345 |
| 62-248226 | 10/1987 | Japan | 156/345 |
| 63-144521 | 6/1988 | Japan | 156/345 |
| 63-211630 | 9/1988 | Japan | 156/345 |
| 64-28922 | 1/1989 | Japan | 156/345 |

OTHER PUBLICATIONS

"Plasmatechnik: Grundlagen und Answendungen; Eine Einführung", 1984, pp. 350-357, Publisher: Carl Hanser, Munich, Vienna.
"Applications of Plasma Processing to VLSI Technology", 1985, pp. 170-185, Publisher: John Wiley & Sons.
Matsuda, A.; Kumagai, K.; and Tanaka, K., "Wide-Range Control of Crystallite Size and Its Orientation in Glow-Discharge Desposited uc-Si:H", Japanese Journal of Applied Physics, vol. 22, No. 1, pp. L34-L36, (Jan. 1983).

Primary Examiner—W. Gary Jones
Assistant Examiner—John J. Bruckner
Attorney, Agent, or Firm—Peter K. Kontler

[57] ABSTRACT

An ionizable gas is accommodated in an ionization chamber having a first end and a second end which is spaced from the first end and is an outlet of the chamber. A first electrode is disposed at the first end and a second electrode in the form of a fine grating or grid is disposed at the second end. The electrodes are connected to a source of radio frequency current which is capable of establishing a potential difference of such magnitude between the electrodes as to ionize the gas. The gas is at a low pressure so that ionization of the gas produces a low-pressure plasma. The area of the first electrode is selected to be so much larger than the area of the second electrode that the magnitude of the voltage drop between the plasma and the first electrode is negligible compared to the voltage drop between the plasma and the second electrode. The positive ions resulting from ionization of the gas are accelerated towards the second electrode and travel through the same towrds an object to be bombarded. Prior to exiting the ionization chamber, the stream of positive ions is combined with a stream of electrons to produce an electrically neutral stream of plasma. Magnetic coils disposed adjacent to the outlet of the chamber generate magnetic fields which shape the streams so that the electrically neutral plasma issuing from the chamber is in the form of a well-defined and homogeneous jet or beam.

1 Claim, 5 Drawing Sheets

MTHOD FOR THE SURFACE TREATMENT OF SEMICONDUCTORS BY PARTICLE BOMBARDMENT

The invention relates to a method for the removal and structuring of the surfaces of solids, as well as the production of surface doping, by particle bombardment.

In addition, a process for the extraction of a plasma beam from a low-pressure plasma, and a device for performing the same, are presented.

The bombardment of the surfaces of solids with beams of atoms or molecules over as large an area as possible is an important process for modern surface and thin film technology. The range of particle energies between several hundred electron volts and several kiloelectron volts is of particular importance here because, in this case, the interactive processes taking place remain limited from a few to a few tens of atomic surface layers.

The applications of such sources of particle beams can generally be divided into two groups:

1. Atoms and molecules of the respective material are released from the surface of the bombarded solid by the particle bombardment (solid atomization by ion bombardment or "sputtering"). The surface particles which have been knocked out fly through the vacuum created in the corresponding bombarding apparatus and can be caught up on suitable carriers (substrates) where they build up thin layers or thin film systems of the material of the atomized solid. In appropriate installations, several solid targets can be simultaneously atomized by bombardment with atoms or molecules. Furthermore, this process can occur in the presence of specific gases or gas mixtures in the corresponding vacuum chamber. This allows layers or layer systems of virtually arbitrary chemical composition to be produced in a very flexible manner.

The removal by particle bombardment of the bombarded surface itself is likewise of great technological significance. For example, contaminating surface layers or surface impurities can be removed in this manner, i.e., substrates for the subsequent coating process can be automatically purified in this manner. Particularly important for modern micro-electronics, but also for other fields, e.g., integrated optics, is the precision structuring of surfaces by large-area particle bombardment. To this end, structures of a material having increased resistance to particle bombardment are applied to a surface of a solid by a photographic process or other means. The uncovered regions of the respective surface are then atomically removed by particle bombardment and the surface thereby structured in the depth direction. The characteristic dimensions of such structures can be varied down to the submicrometer range in the width direction and, depending upon bombardment duration, from the nanometer to the micro-meter range in the depth direction. This process, which is referred to as sputter etching or ion beam etching (Ion Beam Etching, IBE), is characterized in that it operates without chemically aggressive liquids, i.e., very compatibly environmentally, and, due to the anisotropy of the removal process employed, results in very steep edges in the structures which are created. If one uses chemically reactive particles for the bombardment or the bombardment is carried out in the presence of reactive gases, then the surface structuring can be additionally intensified by bombardment-induced chemical reactions (reactive sputter etching or Reactive Ion Beam Etching, RIBE).

2. The second range of applications of large-area particle bombardment of surfaces is based on the fact that beam particles are incorporated in the surface and there frequently cause a chemical reaction. The depth of the reaction zone depends upon the depth of penetration of the energetic particles and the reaction rate is increased in an advantageous manner by the energy brought along by the particles. For instance, if one uses particle beams consisting of carbon atoms or hydrocarbon molecules, thin carbide layers can be formed on metallic surfaces. Analogously, thin "intrinsic", i.e., firmly coalesced with the material, surface layers composed of oxides or nitrides of the respective bombarded material result when using particle beams consisting of oxygen or nitrogen particles. Such surface layers frequently exhibit very favorable mechanical properties and thus, for example, operate to greatly reduce wear vis-a-vis friction or increase the life of machining tools. Furthermore, due to the resulting saturation of free chemical surfaces valences, such layers can have a passivating action with respect to the attack of corrosive gases or liquids. If one employs large-area beams consisting of metal atoms or metal molecules, then a thin conductive surface layer can be produced on originally electrically insulating surfaces such as, for example, ceramic components, by incorporation of the beam particles. An important example of the application of large-area beams consisting of metal atoms or molecules in thin film technology is the surface metallization of insulating or semiconducting substrates. This constitutes an important process step in the production of integrated microelectronic circuits and components.

Since electrically charged particles can be accelerated in a simple manner by means of electrical fields, it is the practice to predominantly employ ion beams of suitable configuration for the exemplary applications mentioned. A significant drawback here is that the electrical charge carried along by the ions must be drawn off via the respective bombarded solid. This can be ensured only for metals or semiconductor materials of correspondingly good conductivity. A very rapid charging of the bombarded surface occurs for poorly conducting materials or insulators. The bombarding ions are decelerated by the opposing electrical field which then comes into existence and the desired surface bombardment is terminated. If the surface has non-conducting regions due to applied masks, then the charges developed there result in electrical interference fields which can significantly affect the mentioned structuring procedure. To avoid these very troublesome effects, one must additionally direct electrons at the bombarded workpiece by means of appropriately arranged electron sources. This occasionally causes significant technical complications which, particularly for large-area bombardment, cannot be eliminated in a satisfactory manner.

Furthermore, large-area ion beam sources can currently be realized only in the form of a bundle of numerous individual beams. Accordingly, the lateral current density distributions are not uniform over the combined bundle area which likewise significantly limits the possible applications of such large-area ion beam sources. To achieve adequate homogeneity of the ion-induced removal, it is frequently necessary to periodically move the bombarded workpiece transverse to the direction of the bombarding beam bundle in a technically complicated manner.

A plasma etching device is known from the West German Offenlegungsschrift No. 2 933 850 and has a high-frequency plasma diode in which one of the two high-frequency-conducting diodes is constructed as a sieve. A portion of the plasma penetrates through the mesh of the sieve. With this device, it is not possible to bombard a workpiece with precision by means of a plasma jet.

In U.S. Pat. No. 4,401,054, a microwave dicharge at electron-cyclotron resonance is maintained. From there, the plasma is directed onto a workpiece or substrate with the help of accelerating effects in a steady diverging magnetic field. The plasma jet is here fundamentally divergent, and thus laterally inhomogeneous, and accordingly cannot be used for many purposes.

It is an object of the invention to create a method for the removal and structuring of the surfaces of solids, as well as the production of surface doping, by particle bombardment which avoids the outlined drawbacks.

In accordance with the invention, this object is achieved by using a plasma beam with a high degree of parallelism, and hence a high degree of lateral homogeneity of the current density, for bombardment. The plasma beam consists of an equal flux of positive ions and electrons.

The plasma beam is extracted from a low-pressure plasma which is produced by means of electrical and magnetic fields in that radio frequency voltage is applied between an extraction electrode constructed as a fine grid and another electrode. The plasma is maintained between the electrodes and plasma ions are accelerated towards the extraction electrode in contact with the plasma since the plasma is self-biasing against the plasma to a higher potential. The magnitude of the thus self-establishing ion-accelerating voltage between the plasma and the extraction electrode is determined by the amplitude of the radio frequency voltage dropping between the plasma and the extraction electrode. The extracted ion current is superimposed with an electron current of like magnitude flowing synchronously with the high frequency to compensate for the ion current. The low-pressure plasma and the extracted plasma beam are shaped by steady magnetic fields of suitable magnitude and configuration.

A device in accordance with the invention for carrying out the indicated method can be realized in that a plasma vessel is provided with two electrodes of large area which are connected with a radio frequency generator by way of a matching network. The areas of the electrodes are selected such that virtually the entire radio frequency voltage decays at an electrode constructed as a fine grid.

According to another embodiment of the invention, one of the electrodes is pot-shaped and arranged so as to project into the interior of the plasma vessel.

A further embodiment of the invention resides in that one of the electrodes is pot-shaped and placed on the plasma vessel.

A special embodiment of the invention is to be seen in that one of the electrodes surrounds the plasma vessel externally.

It is also within the scope of the invention for the electrode which is constructed as a fine grid to be secured to an automatic stressing device.

According to the invention, the crosspieces of the electrode constructed as a fine grid can be embedded in insulating material.

Furthermore, in the device of the invention, the openings of the electrode constructed as a fine grid are to be smaller than the thickness of the space charge layer between this electrode and the plasma.

The advantages achieved by the invention reside particularly in that the above-described drawbacks are not observable when using a plasma beam. This plasma beam consists, on the one hand, of the positive ion component required for particle bombardment but conducts a like number or density of electrons with it. Such a plasma beam is therefore electrically neutral as a whole. Upon bombardment of poorly conducting or electrically insulating surfaces, there is accordingly no build-up of electrical charge to disrupt the operation. Even changes in conductivity which may be caused during the bombardment period by the development of electrically insulating surfaces on an originally electrically conducting workpiece do not disturb the surface treatment with such a plasma beam. Similarly, there is no disruption when specified surface regions are electrically non-conducting due to the application of insulating masks for surface structuring by particle bombardment, i.e., when the electrical conductivity of the surface to be treated varies laterally. As a result of the "quasi neutrality" of the plasma beam consisting of positive ions and negative electrons, additional electron sources or other measures as are employed in the case of pure ion beams are no longer required.

A plasma beam generated in accordance with the invention exhibits another decided advantage over the previously mentioned ion beam bundle sources of large area: Due to the special mode of production, the current density distribution in such a plasma beam transverse to the beam direction is completely homogeneous and has no modulation structure. This makes it possible to achieve a completely homogeneous large-area removal of the surfaces of workpieces, or a surface structuring under constantly identical conditions at all locations of the bombarded region.

The invention is described in detail with reference to the drawings which also contain exemplary embodiments of devices for carrying out the process.

BRIEF DESCRIPTION OF THE DRAWINGS

There is shown

The plasma beam is generated using a physical effect which arises when a high frequency conducting electrode is brought into contact with a low-pressure plasma produced in any manner. Considering the variation with time (FIG. 1) of the currents of electrically charged particles which flow towards such an electrode from the plasma, positive plasma ions can flow towards this electrode while it is negative relative to the plasma during a period of the high frequency voltage between the plasma and the electrode. On the other hand, plasma electrons flow towards this electrode when it is at a positive electrical potential relative to the plasma. Moreover, due to the relatively high temperature associated with their kinetic energy, plasma electrons also reach the electrode when it is not too strongly negative relative to the plasma; an electron retarding current then flows.

If now such a high frequency conducting electrode were positive and negative relative to the plasma during respective halves of a high frequency period, then more plasma electrons than positive plasma ions would flow towards the electrode per period due to the greater electron mobility and velocity. However, this is not possible because of the quasi neutrality condition for an electrical gas discharge plasma which requires that the same number of positive and negative charges must always be present per unit volume of a plasma. This condition is usually fulfilled by the plasma generation process itself. Nevertheless, it is generally true that build-up of an electrical space charge will occur when the loss of a particular charge carrier component predominates. The sign of the accumulated space charge will be opposite to that of the charge carrier component leaving the plasma and would thus prevent this component from flowing off.

As a consequence of this self-regulating action, an electrical gas discharge plasma will of itself be at a sufficiently high positive potential upon contacting an electrode which conducts high frequency. The result of this "self-biasing" effect is that the ions can flow towards the electrode during the entire period of the high-frequency voltage and that a corresponding electron pulse flows towards the electrode only during a short time interval within a high-frequency period, namely, when the potential of the plasma and the electrode briefly approximate one another within a high-frequency period. In this manner, the number of positive ions and electrons leaving the plasma exactly compensate one another, i.e., no D.C. current flows toward such a high-frequency-conducting electrode but only an electrical displacement current.

Figure 1:
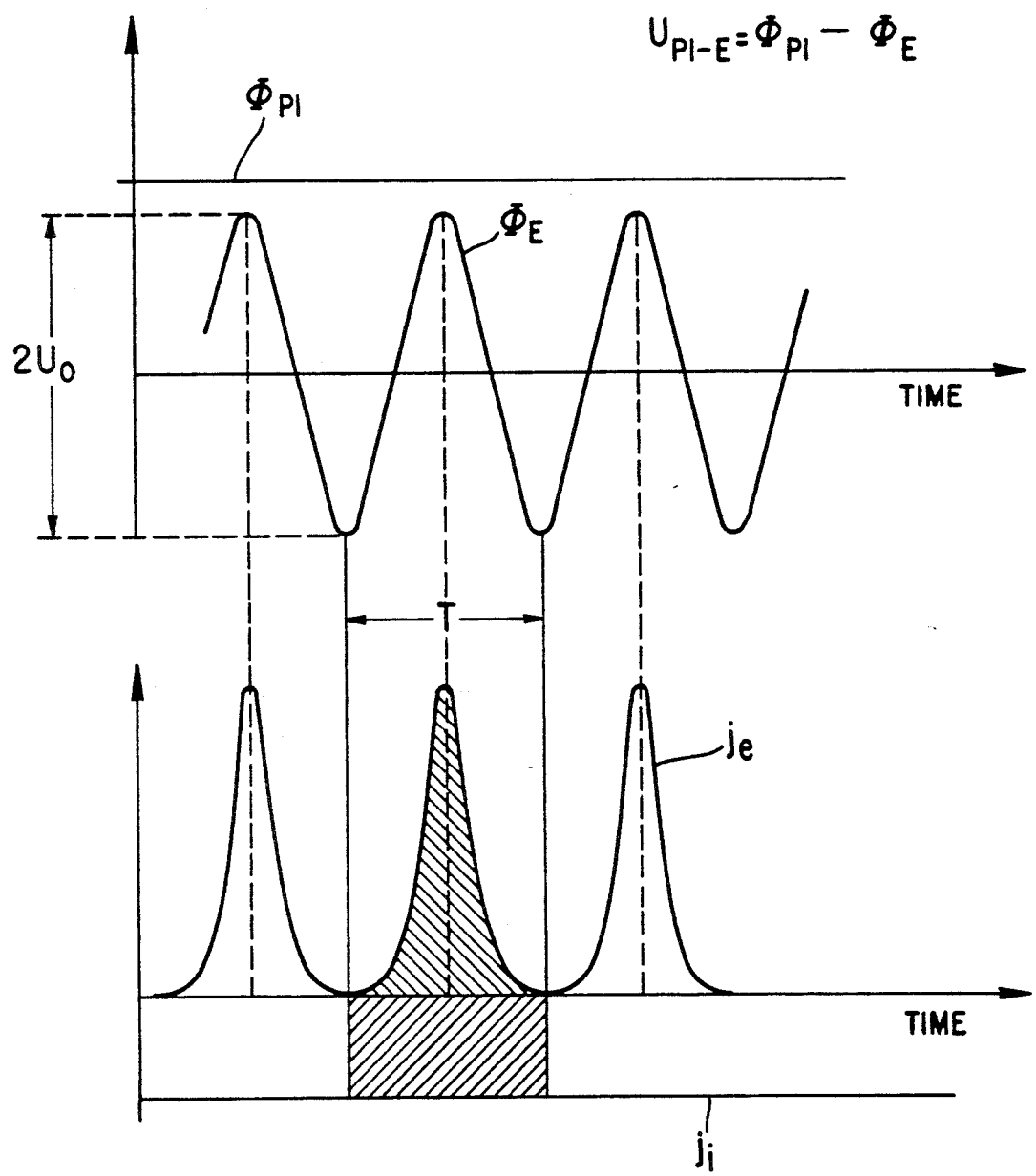
FIG. 1 a graph for explaining the operating principle of the plasma jet source.

The relationships outlined here are illustrated in FIG. 1. From there it can be seen that, in order to maintain the quasi neutrality of the plasma, a d.c. voltage $U_{Pl-E}$ which corresponds to a good approximation to the amplitude of the high-frequency voltage is established between the plasma and the high-frequency-conducting electrode. As a rule, $U_{Pl-E}$ exceeds the high-frequency amplitude $U_0$ by a voltage of the order of $kT_e/e_0$ (k is the Boltzmann constant, $T_e$ the electron temperature and $e_0$ the elemental charge) since, due to their relatively great kinetic energy, the electrons can buck an additional small decelerating voltage of the order of $kT_e/e_0$.

The behavior described explains the principle of the plasma beam source. The high frequency conducting electrode is constructed as a suitably configured wire net or in the form of parallel wires. A potential difference which accelerates ions self-develops between a low-pressure plasma and this "extraction electrode" using the outlined effect. The potential difference consists of a high-frequency voltage of suitable frequency f and amplitude $U_0$, and the self-developing d.c. voltage of magnitude $U_0 + kT_e/e_0$ which.

A Schottky-Langmuir space charge layer, which is known from the technical literature on physical effects and has a thickness d satisfying the equation $$d = (4\epsilon_0/9j_i)^{\frac{1}{2}}(2e_0/M_i)^{\frac{1}{4}} U^{3/4}, \qquad (1)$$

then forms between the plasma and the extraction electrode. In the present case
  $j_i$ is the extracted ion current density,
  U is the electrical voltage drop in the space charge layer,
  $\epsilon_0$ is the dielectric constant of the vacuum,
  $M_i$ is the mass of the extracted ions. During a high-frequency period, the voltage U varies upwards by the value of the "self-biasing" voltage $U_0 + kT_e/e_0$ and downwards by the magnitude $U_0$ of the high-frequency amplitude.

Positive plasma ions are accelerated from plasma potential to the extraction electrode through the potential drop before the same and then leave the plasma chamber through the extraction electrode in a direction towards the surface of the solid to be bombarded. As already described, an electron pulse is superimposed, during each high-frequency period, on the ion current which always flows through the entire high-frequency period. Since the electron pulse is superimposed such that the overall current flowing out of the plasma is zero as regards the sign of the charge on the two types of particles, a plasma beam is produced in this manner.

A simple calculation shows that, if the frequency f of the voltage employed is so high that the ions experience a sufficient number of radio frequency periods on their way through the space charge layer whose thickness d likewise oscillates with the frequency f, the ion energy in the extracted plasma beam is, to a good approximation, determined by the "self-biasing" potential which develops. When the extracted ion current density, $j_i$, in equation 1 is of the order of a few milliamperes per square centimeter, which is typical for low pressure plasmas, such conditions are achieved when f is in the megahertz range, i.e., when a radio frequency voltage is employed. Except for deviations of the order of $kT_e$, the kinetic energy of the ion component in the plasma beam is then given, to a good approximation, by the amplitude of the radio frequency voltage between the extraction electrode and the plasma. For simple positively charged ions, the kinetic ion energy is accordingly $E_i \approx e_0 U_0$.

The gas discharge plasma from which the plasma beam is extracted in the manner described can be produced in any fashion. It is particularly practical to produce the plasma by means of radio frequency energy, i.e., to use the radio frequency generator which is required to extract the plasma beam for plasma excitation also.

For plasma beam sources in which the extraction of a plasma beam takes place according to the principle outlined here, it is particularly advantageous to use a capacitive arrangement for plasma production. Such an arrangement is employed for the plasma beam source described here.

Figure 2:
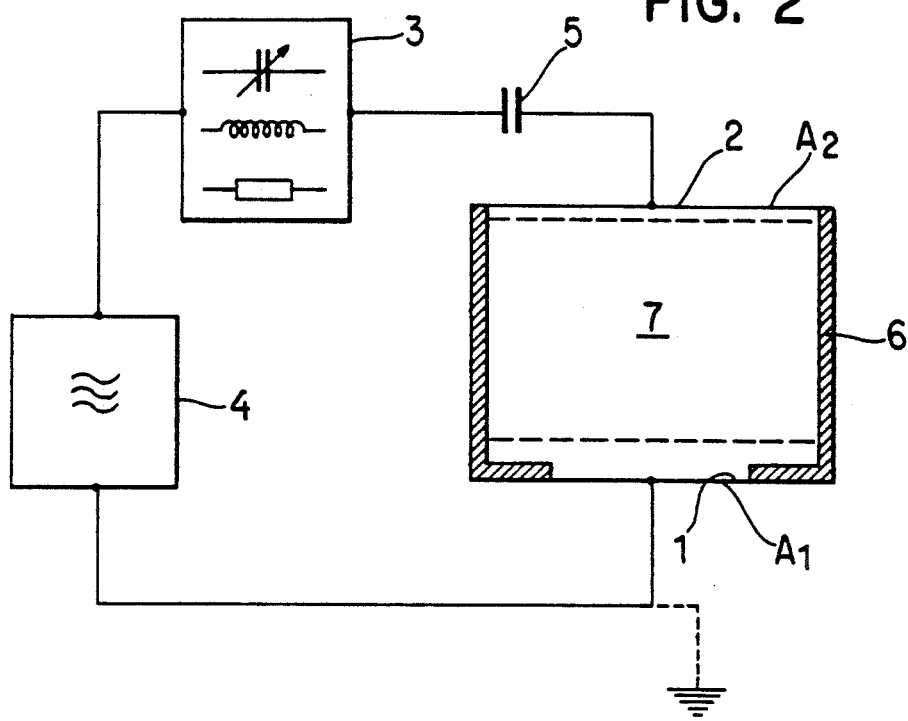
FIG. 2 schematically the design of the beam source.

The basic structure of the plasma beam source is illustrated in FIG. 2. An electrical radio frequency field is generated between two electrodes 1,2 having areas $A_1$ and $A_2$ and partially ionizes a gas located between the two electrodes at reduced pressure in a plasma vessel 6. To this end, a radio frequency voltage source 4 in the form of a radio frequency generator is connected to the two electrodes 1,2 via a suitable matching network 3 consisting of inductive, capacitive and, if necessary, ohmic resistances. The two electrodes 1,2 of this capacitive arrangement constitute, in the above sense, radio frequency-conducting electrodes with respect to the generated low-pressure plasma 7. Since only a displacement current flows towards such electrodes as outlined earlier, it is immaterial whether the two metallic electrodes 1,2 are in direct contact with the plasma or are separated from the interior of the plasma chamber by an insulating vessel wall through which the displacement current flows. Moreover, suitable capacitors 5 can be inserted in the high-frequency circuit.

Figure 3:
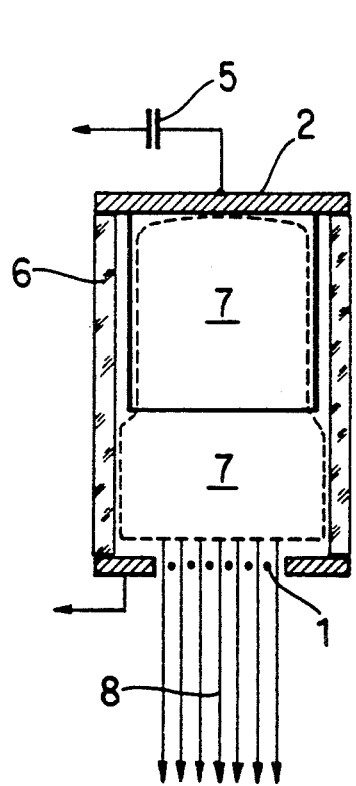
FIGS. 3, 4 and 5 different embodiments of the electrodes.
Figure 4:
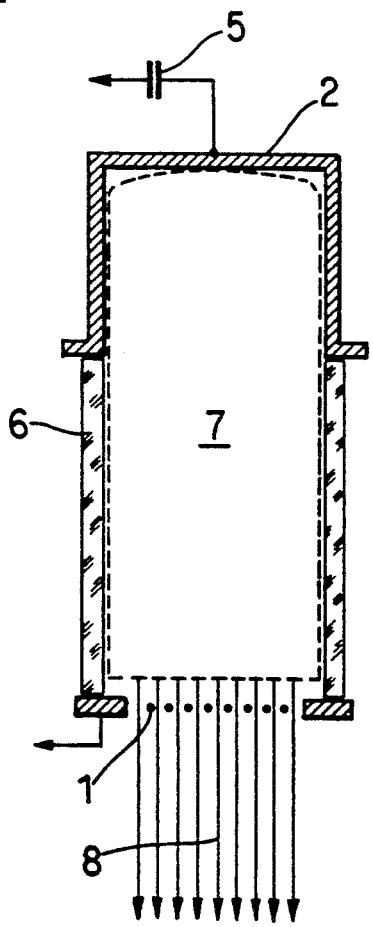
Figure 5:
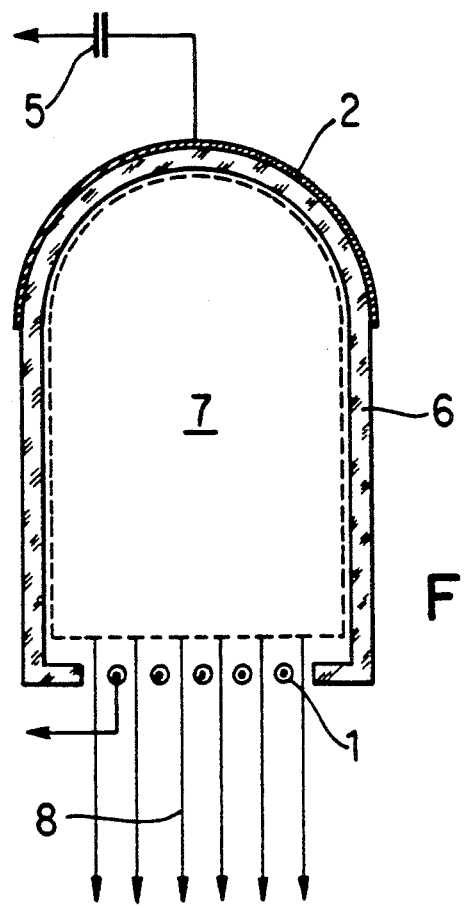

It is important for the plasma beam source that one of the two electrodes (1) for plasma production is entirely or partly in the form of an extraction grid through which a plasma beam is extracted into an adjoining bombardment chamber according to the principle described above. This extraction electrode 1 is thus always in contact with the generated low-pressure plasma. As illustrated in FIGS. 3, 4 and 5, the second coupling electrode 2 can, in contrast, be seated inside the plasma vessel 6, or constitute part of the wall of this vessel, or rest on the wall of the plasma vessel 6 externally thereof (FIG. 5).

The ion component of the generated plasma beam 8 is accelerated in accordance with the above-described principle by the d.c. voltage which is automatically established between the plasma and a radio frequency-conducting electrode in the form of an extraction grid 1. The kinetic energy of this ion component is, to a good approximation, determined by the amplitude of the radio frequency voltage between the extraction grid 1 and the plasma.

It is further of great importance for the developed plasma beam source that it be possible for virtually the entire radio frequency voltage established between the two plasma-generating electrodes to decay in one of the two transition regions between the plasma and the electrodes. The extraction grid 1 is here selected as this electrode.

According to this principle, the equation $$U_1/U_2 = (A_2/A_1)^4 \quad (2)$$

applies to the radio frequency partial voltages $U_1$ and $U_2$ which respectively decay between one of the electrodes 1,2 and the plasma 7. It is clear from the Equation (2) that virtually the entire radio frequency voltage between the two electrodes will decay between the plasma 7 and the extraction electrode 1 if only the area $A_1$ of the extraction electrode is sufficiently small relative to the area $A_2$ of the other electrode 2 ("counterelectrode"). Already at an areal ratio $A_1/A_2$ of approximately ½, which is readily achievable in practice, only about 1% of the total radio frequency voltage decays at the counterelectrode 2. This is very advantageous for the practical operation of such a plasma beam source. Since a d.c. voltage is likewise established between the radio frequency-conducting electrode 2 and the plasma 7 and has a magnitude of the order of the small radio frequency amplitude $U_{0,2}$ of the radio frequency voltage $U_2$ decaying there, sputtering of the material of the counterelectrode 2 by the ions impinging the same is completely prevented due to the small value of $U_{0,2}$. Otherwise, if metallic components of the counterelectrode 2 were exposed to the plasma 7, interfering metallic coatings of sputtered material would then very rapidly form on the inner walls of the plasma vessel 6.

Equation (2) applies when the plasma density n before the two electrodes 1,2 is the same. If this is not the case as, for example, at a pot-shaped counterelectrode 2 into which the plasma 7 must expand, then the thickness d of the space charge layer increases there per Equation (1). This leads to a decrease in the layer capacitance C which is proportional to $1/d$ and thus to an increase in the radio frequency voltage drop $U_2$ at the counter-electrode. Since $U_2$ is proportional to $1/C_2$, $U_2$ is likewise increased under certain circumstances when, in the case of a counterelectrode 2 which is supported on the vessel wall externally (FIG. 5), the total capacitance $C_2$ between the plasma 7 and the counterelectrode 2 is decreased, and $U_2$ thereby increased, by the series arrangement of the layer capacitance and the additional capacitance due to the vessel wall. This and similar effects can, however, be readily and reliably corrected by a further increase in the areal ratio $A_2/A_1$.

The radio frequency circuit schematically illustrated in FIG. 2 can be grounded at any point. According to the invention, the extraction grid 1 is advantageously selected for this purpose and, to this end, is rigidly connected to ground. In this manner, the plasma beam 8 enters the bombardment chamber at ground potential with the kinetic energy of the ion component as established by the radio frequency amplitude $U_{0,1}$ at the extraction electrode 1. All walls of the bombardment chamber, of which the extraction electrode 1 constitutes part, as well as all remaining inserts such as workpieces to be treated, then advantageously likewise lie at ground potential.

Due to the very small potential drop at the counterelectrode 2, the plasma 7 itself always lies at the potential of this electrode and the potential thereof thus also follows the variation in the radio frequency voltage between the counterelectrode 2 and the grounded extraction electrode 1.

In principle, the plasma vessel 6 can have an arbitrary shape. However, it is advantageously designed as a glass or ceramic tubular section whose cross-sectional shape can be matched to the respective desired cross-sectional shape of the generated plasma beam. The two electrodes 1,2 are then advantageously arranged at the two end faces of such a tubular section.

Figure 6:
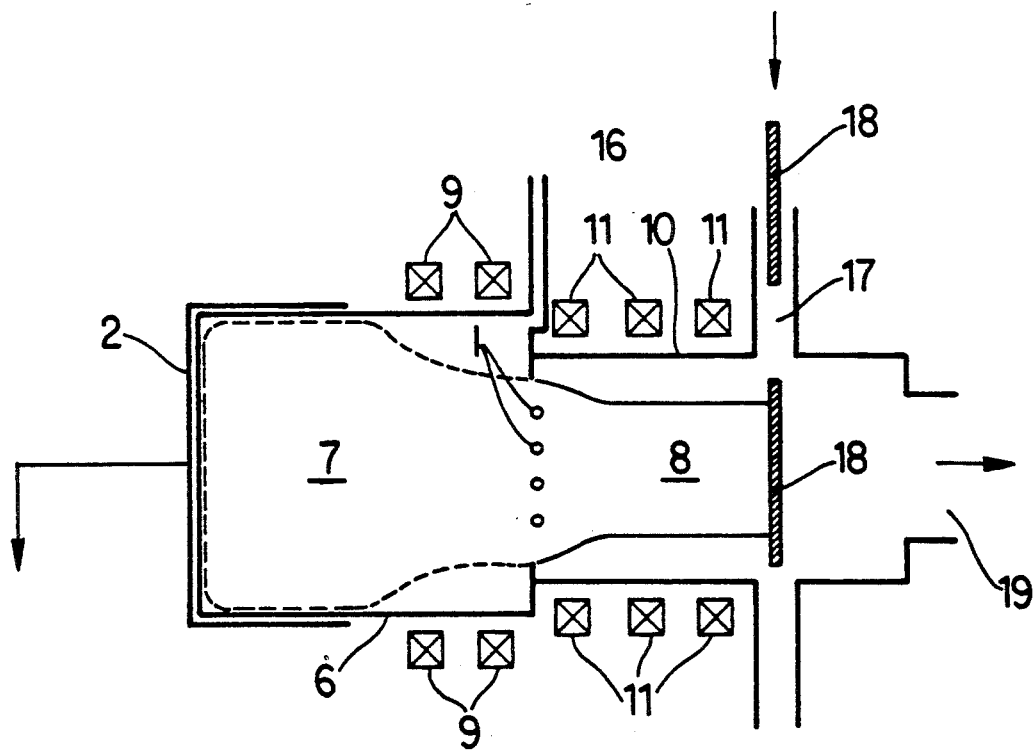
FIG. 6 schematically an arrangement for the bombardment of workpieces.

To improve the properties of the source, it is further advantageous to overlay the plasma vessel 6 with suitably formed, axial, steady magnetic fields by surrounding it on the outside with a set of magnetic field coils 9 in which the plasma vessel 6 is concentrically arranged (FIG. 6). In the regions where the magnetic field lines are parallel to the walls of the plasma vessel 6, the diffusional movement of plasma particles towards the walls is reduced so that the so-called wall losses can be greatly reduced. This leads to an increase in the plasma density and accordingly to an increase in the ion and electron current density in the extracted plasma beam 8. It is further important for the magnetic field at the location of the extraction electrode 1 to be suitably shaped so that the configuration of the plasma jet upon exiting into the bombardment chamber 10 can be changed by additional magnetic field coils 11. Thus, its cross section can be reduced, for example, or, if necessary, it can be expanded downstream of the extraction system or deflected laterally. Magnitude, direction and shape of the magnetic fields overlying the plasma vessel can be varied in many ways and appropriately chosen by the geometric arrangement of the coils which generate the magnetic fields as well as by suitable selection of the magnitude and direction of the respective coil currents. In FIG. 6, the inlet for the working gas is indicated at 16 and the workpiece insertion system at 17. The workpieces to be treated in the bombardment chamber 10 are 18. The pumping connection is indicated at 19.

Figure 7:
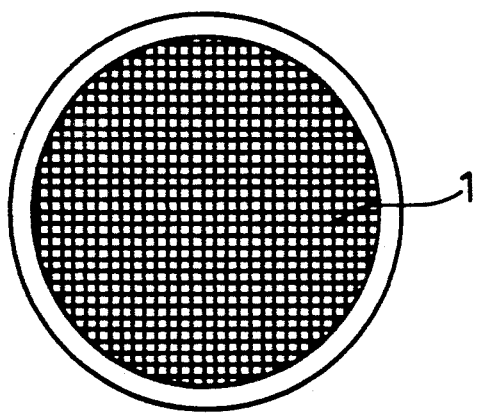
FIGS. 7, 8 and 9 conceivable embodiments of the extraction electrode.
Figure 8:
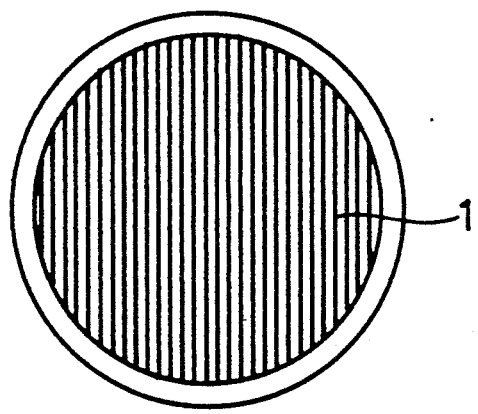
Figure 9:
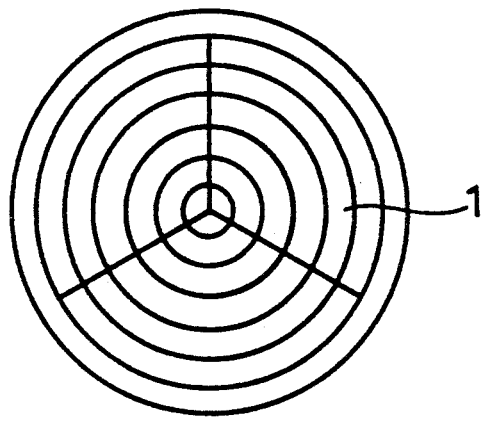

As already explained, the extraction electrode 1 is advantageously grounded. Therefore, it can be directly placed in a suitable opening of the similarly grounded separating wall between the plasma vessel 6 and the bombardment chamber 10 or secured there. The extraction electrode 1 should have the highest possible permeability for the extracted plasma particles. Hence, it is advantageously made in the form of a fine grid or wire net having an arbitrary mesh structure. The only requirement is that the characteristic dimensions of the grid openings be smaller than the thickness of the space charge layer between the extraction electrode 1 and the plasma 7. Some suitable grid configurations for the extraction electrode are illustrated in FIGS. 7, 8 and 9 by way of example.

Figure 10:
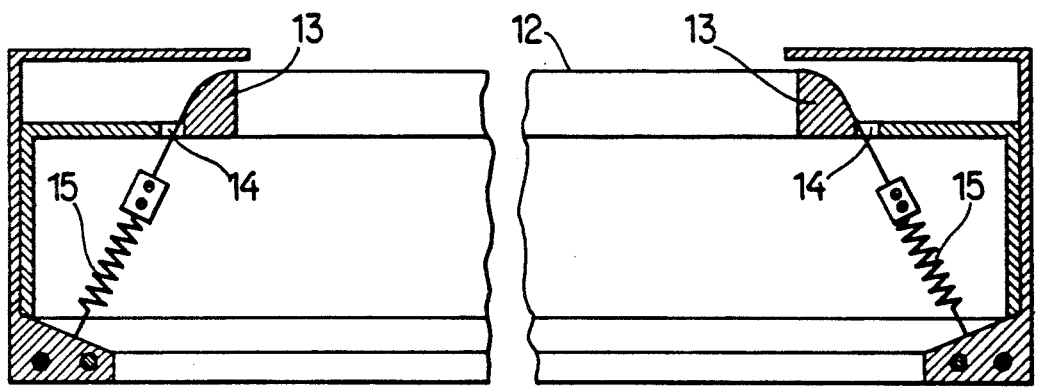
FIG. 10 a stressing device for the extraction electrode.

During operation of the plasma beam source, the mesh wires of the extraction electrode 1 can deform due to thermal loading. In order to constantly maintain good flatness of the surface of the electrode 1 and to prevent a detrimental influence on the plasma beam 8 by such effects, the grating holder for the extraction electrode 1 is advantageously provided with a stressing device 20. A possible embodiment is shown in FIG. 10. The grid wire 12 passes over a rounded bead 13 through bores 14 and remains constantly stressed during the length changes by the action of the springs 15.

The only requirement to be fulfilled by the counterelectrode 2 is that the area of the surface thereof which faces the plasma 7 is a multiple of the area of the grid-shaped extraction electrode 1. To this end, it can be designed, for example, as a metallic pot with an opening which faces the plasma (FIG. 4). It is particularly advantageous to design part of the counterelectrode 2 as a shield against sputter coating which is disposed inside the plasma vessel 6 close to the vessel walls (FIG. 3). The use of such a shield is beneficial in regard to an increased operating period for the plasma beam source since the metallic crosspieces of the extraction system may also be sputtered by the energetic ions of the plasma beam which impinge upon the same. Without an appropriately formed sputter shield, the sputtered material can deposit on the inner walls of the plasma vessel and there generate an interfering d.c. current or high-frequency conducting path between the two electrodes 1 and 2. In the simplest case, such a shield consists of a row of closed metallic rings (or suitably formed metallic bands) which are located one below the other at a distance of one to a few millimeters from the inner wall of the plasma vessel 6 and, by a shadow effect, prevent the formation of closed metallic coatings from sputtered particles which would otherwise impinge upon the wall. As already indicated, the counterelectrode 2 can, however, be located completely outside of the plasma vessel 6 (FIG. 5).

Figure 11:
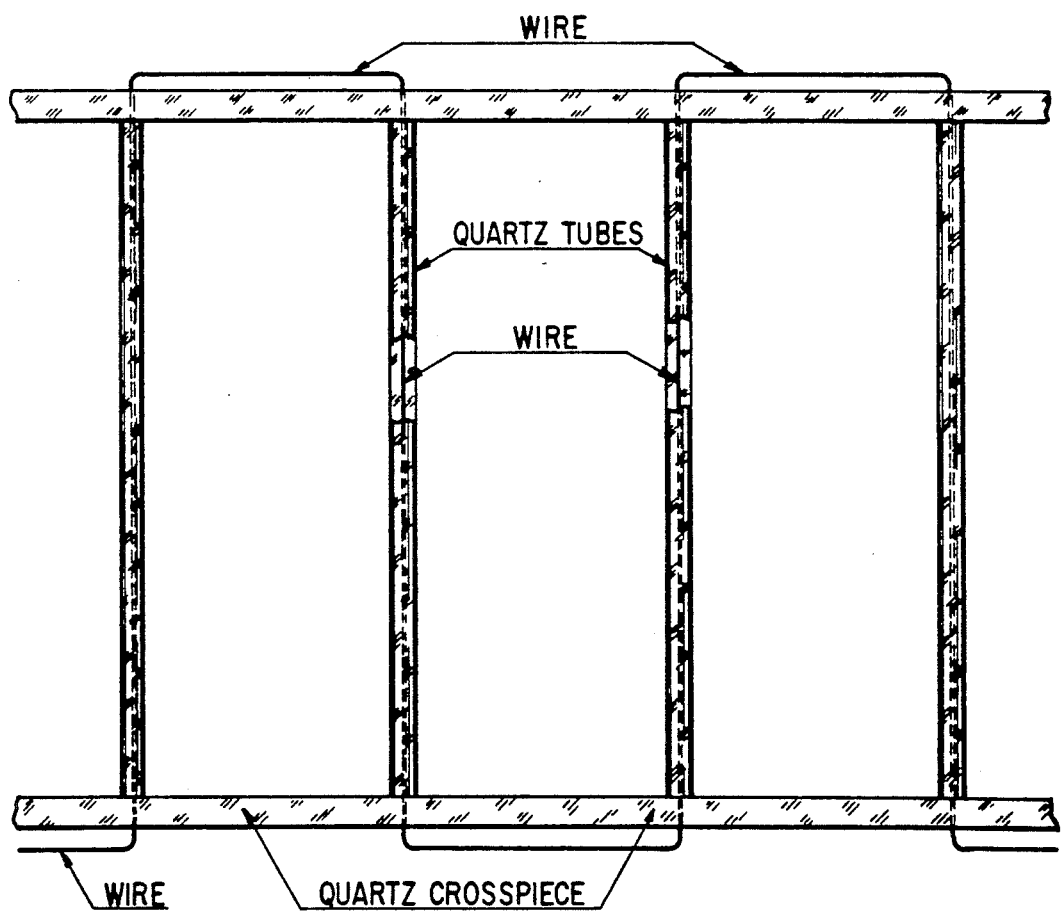
FIG. 11 a special embodiment of the extraction electrode fragmentarily on an enlarged scale.

As explained previously, only dielectric displacement currents flow over the two electrodes of the capacitive arrangements for plasma generation described here. Therefore, it is not necessary for any metallic, i.e., electrically conductive, parts of the extraction electrode or counterelectrode 1,2 to be in direct contact with the plasma 7. For instance, the crosspieces of the extraction electrode can be embedded in an insulating material, e.g., quartz (FIG. 11). Since the counterelectrode 2 can also sit externally of the plasma vessel 6 (FIG. 5), it thus becomes possible to make the interior of the plasma vessel 6 totally free of metal and thereby resistant to chemically aggressive media. This allows chemically aggressive gases, which are of great importance for certain applications such as reactive ion beam etching RIBE mentioned earlier, to be used as plasma gases. If, for example, the plasma vessel 6 and the coating of the extraction grid 1 are made entirely of quartz, then it becomes possible to generate the plasma beams 8 from highly reactive gases without any destruction of the plasma beam source.

Based on the preceding description of the principle of the plasma jet source and characteristic measurements obtained with a prototype, the following observations can be made for the practical design of such plasma beam sources:

In principle, there are no limitations to the cross-sectional configuration and cross-sectional size of the plasma beams generated according to the various processes.

The frequency f of the radio frequency voltage used must be selected such that the time $1/f$, i.e., the duration T of a radio frequency period, is very short compared to the time t which the ions accelerated from the plasma require to travel the average thickness $\bar{d} = \bar{d}(U_{0,E})$ of the space charge layer between the plasma and the extraction plane. Upon appropriate selection of the areal ratio of the counterelectrode 2 and the extraction electrode 1, the amplitude $U_{0,1}$ which determines the acceleration of the ionic component of the plasma beam is the same as the amplitude $U_0$ of the total radio frequency voltage between the two electrodes. The energy of the ions in the plasma beam 8 can accordingly also be freely selected by varying the amplitude of the radio frequency voltage from a suitable generator 4.

Experiments with a prototype of the source have shown that an operating frequency of $f \approx 20$ MHz fulfills the requirement $1/f >> t$ when the plasma beam source is operated with the working gas argon at a working pressure of several $10^{-4}$ mbar and a radio frequency amplitude greater than 500 volts. The ion current density in an argon plasma beam generated in the prototype of the plasma beam source according to the invention reaches a value of approximately 4 mA/cm$^2$ with good homogeneity across the entire cross section of the beam.

I claim:

1. A method for the extraction of a plasma beam from a low-pressure plasma, comprising the steps of generating a low-pressure plasma by electric and magnetic fields, applying a radio frequency voltage between an extraction electrode which comprises a fine grid and a second electrode, maintaining the plasma between the extraction and second electrodes with an attendant generation of ion accelerating d.c. voltage between the plasma and the extraction electrode whereby the plasma is positively self-biasing against the extraction electrode and the extracted steadily flowing ion current is superimposed with an electron current of the same magnitude pulsating synchronously with the applied radio frequency to compensate for the ion current, controlling the magnitude of the d.c. voltage and hence the beam energy by the amplitude of the radio frequency voltage between the plasma and the extraction electrode, with and shaping the low-pressure plasma and the extracted plasma beam by d.c. magnetic fields of suitable magnitude and configuration.

* * * * *